US010276782B2

(12) United States Patent
Braganca et al.

(10) Patent No.: US 10,276,782 B2
(45) Date of Patent: Apr. 30, 2019

(54) HALF SELECT METHOD AND STRUCTURE FOR GATING RASHBA OR SPIN HALL MRAM

(71) Applicant: Western Digital Technologies, Inc., Irvine, CA (US)

(72) Inventors: Patrick M. Braganca, San Jose, CA (US); Andrei Gustavo Fidelis Garcia, Palo Alto, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/286,748

(22) Filed: Oct. 6, 2016

(65) Prior Publication Data

US 2017/0092844 A1  Mar. 30, 2017

Related U.S. Application Data

(63) Continuation of application No. 14/871,118, filed on Sep. 30, 2015, now Pat. No. 9,490,297.

(51) Int. Cl.
*H01L 43/06* (2006.01)
*G11C 11/16* (2006.01)
(Continued)

(52) U.S. Cl.
CPC ............ *H01L 43/06* (2013.01); *G11C 11/161* (2013.01); *G11C 11/1673* (2013.01);
(Continued)

(58) Field of Classification Search
CPC ... G11C 11/18; G11C 11/161; G11C 11/1673; G11C 11/1675; H01L 43/08;
(Continued)

(56) References Cited

U.S. PATENT DOCUMENTS 6,331,944 B1  12/2001  Monsma et al.
6,649,960 B1  11/2003  Cross
(Continued)

OTHER PUBLICATIONS

Kim, et al.; DSH-MRAM: Differential Spin Hall MRAM for On-Chip Memories; Electron Device Letters; IEEE, vol. 34, No. 10; Oct. 2013; 1 page.
(Continued)

*Primary Examiner* — Victor A Mandala
(74) *Attorney, Agent, or Firm* — Stoel Rives LLP; Joseph J. Hawkins

(57) ABSTRACT

The present disclosure generally relates to SHE-MRAM memory cells. A memory cell array comprises one or more memory cells, wherein each of the one or more memory cells comprises a gate electrode, an insulating layer, a spin orbit material electrode, a MTJ, and a top electrode parallel to the gate electrode. The gate electrode and the top electrode are perpendicular to the spin orbit material electrode. By applying a voltage to the gate electrode, passing a current along the spin orbit material electrode, and utilizing Rashba and/or spin Hall effects, writability of select memory cells is enhanced, allowing for individual memory cells to be written upon without disturbing neighboring memory cells. Additionally, Rashba and/or spin Hall effects in neighboring memory cells may be suppressed to ensure only the selected memory cell is written.

21 Claims, 2 Drawing Sheets

(51) Int. Cl.
*G11C 11/18* (2006.01)
*H01L 21/28* (2006.01)
*H01L 27/22* (2006.01)
*H01L 43/04* (2006.01)
*H01L 43/08* (2006.01)
*H01L 43/10* (2006.01)
*H01L 29/423* (2006.01)

(52) U.S. Cl.
CPC .......... *G11C 11/1675* (2013.01); *G11C 11/18* (2013.01); *H01L 21/28* (2013.01); *H01L 27/222* (2013.01); *H01L 29/4238* (2013.01); *H01L 43/04* (2013.01); *H01L 43/08* (2013.01); *H01L 43/10* (2013.01)

(58) Field of Classification Search
CPC ....... H01L 43/06; H01L 21/28; H01L 27/222; H01L 43/10; H01L 43/04; H01L 29/4238
See application file for complete search history.

(56) References Cited

U.S. PATENT DOCUMENTS

| | | |
|---|---|---|
| 7,006,375 B2 | 2/2006 | Covington |
| 7,596,018 B2 | 9/2009 | Johnson |
| 8,963,222 B2 | 2/2015 | Guo |
| 2005/0205952 A1 | 9/2005 | Park et al. |
| 2006/0083054 A1 | 4/2006 | Jeong |
| 2009/0161265 A1* | 6/2009 | Sugano .............. G01R 33/1284 360/324 |
| 2009/0190264 A1* | 7/2009 | Fukuzawa ............. B82Y 10/00 360/246.4 |
| 2010/0097063 A1* | 4/2010 | Ando .................... B82Y 10/00 324/316 |
| 2013/0343118 A1 | 12/2013 | Kim et al. |
| 2014/0010004 A1* | 1/2014 | Suzuki ................. H01L 27/228 365/158 |
| 2014/0056060 A1 | 2/2014 | Khvalkovskiy et al. |
| 2014/0264680 A1* | 9/2014 | Kim ...................... H01L 27/222 257/427 |
| 2014/0269035 A1 | 9/2014 | Manipatruni et al. |
| 2015/0041934 A1 | 2/2015 | Khvalkovskiy et al. |
| 2015/0200003 A1 | 7/2015 | Buhrman et al. |
| 2016/0005954 A1* | 1/2016 | Erickson ................ H01L 43/08 257/421 |
| 2016/0042778 A1 | 2/2016 | Manipatruni et al. |

OTHER PUBLICATIONS

Van den Brink, et al.; AIP; Applied Physics Letters; Spin-Hall-Assisted Magnetic Random Access Memory; Jan. 8, 2014; 2 pages.

* cited by examiner

HALF SELECT METHOD AND STRUCTURE FOR GATING RASHBA OR SPIN HALL MRAM

CROSS-REFERENCE TO RELATED APPLICATIONS

This application is a continuation of co-pending U.S. patent application Ser. No. 14/871,118, filed Sep. 30, 2015, which application is herein incorporated by reference.

BACKGROUND OF THE DISCLOSURE

Field of the Disclosure

Embodiments of the present disclosure generally relate to a non-volatile memory, particularly spin-hall-effect-based magnetoresistive random access memory (SHE-MRAM).

Description of the Related Art

The heart of a computer is a magnetic recording device which typically includes a rotating magnetic media or a solid state media device. A number of different memory technologies exist today for storing information for use in a computing system. These different memory technologies may, in general, be split into two major categories: volatile memory and non-volatile memory. Volatile memory may generally refer to types of computer memory that requires power to retain stored data. Non-volatile memory, on the other hand, may generally refer to types of computer memory that do not require power in order to retain stored data.

Recently, a number of emerging technologies have drawn increasing attention as potential contenders for next generation non-volatile memory. One such memory technology is magnetoresistive random access memory (MRAM). MRAM offers fast access time, infinite read/write endurance, radiation hardness, and high storage density. Unlike conventional RAM chip technologies, MRAM data is not stored as an electric charge, but instead stores data bits using magnetic moments. MRAM devices may contain memory elements formed from two magnetically polarized plates, each of which can maintain a magnetic polarization field, separated by a thin insulating layer, which together form a magnetic tunnel junction (MTJ) layer. The thin insulating layer may be a barrier layer. MTJ memory elements can be designed for in-plane or perpendicular magnetization of the MTJ layer structure with respect to the firm surface. One of the two plates is a permanent magnet (i.e., has a fixed magnetization) set to a particular polarity; the polarization of the other plate will change (i.e., has free magnetization) to match that of a sufficiently strong external field. Therefore, the cells have two stable states that allow the cells to serve as non-volatile memory cells.

One type of MRAM employing the MTJ memory element is spin-torque-transfer MRAM (STT-MRAM). However, the MTJ memory elements in STT-MRAM devices suffer from wear-effects due to driving a sufficient amount of current for switching through the MTJ, including through the barrier layer. Typically, a large amount of write current is required for switching the state of the cell. Over time, the barrier layer breaks down due to the amount of current, rendering the MTJ inoperable. Additionally, in STT-MRAM devices, it can be difficult to isolate a single MTJ element for writing without disturbing neighboring MTJ elements, and a large transistor may be necessary in order to select an individual MTJ element.

Therefore, there is a need in the art for an improved MRAM device that is able to select individual MTJ elements without disturbing neighboring MTJ elements, and is also able to enhance the efficiency of the write current to prevent breakdown of the barrier layer.

SUMMARY OF THE DISCLOSURE

The present disclosure generally relates to SHE-MRAM memory cells. A memory cell array comprises one or more memory cells, wherein each of the one or more memory cells comprises a gate electrode, an insulating layer, an electrode composed of a spin orbit material, a MTJ, and a top electrode parallel to the gate electrode. The gate electrode and the top electrode are perpendicular to the spin orbit material electrode. By applying a voltage to the gate electrode, passing a current along the spin orbit material electrode, and utilizing Rashba and/or spin hall effects, writability of select memory cells is enhanced, allowing for individual memory cells to be written upon without disturbing neighboring memory cells. Additionally, Rashba and/or spin hall effects in neighboring memory cells may be suppressed to ensure only the selected memory cell is written.

In one embodiment, a memory cell comprises a gate electrode, an insulating layer disposed on the gate electrode, an electrode comprised of a spin orbit material disposed on the insulating layer and perpendicular to the gate electrode, a free layer disposed on the spin orbit material layer, a barrier layer disposed on the free layer, a fixed layer disposed on the barrier layer, and a top electrode disposed on the fixed layer. The top electrode is parallel to the gate electrode and perpendicular to the spin orbit material electrode.

In another embodiment, a memory cell array comprises one or more memory cells. Each of the one or more memory cells further comprises a gate electrode, an insulating layer disposed on the gate electrode, an electrode comprised of spin orbit material disposed on the insulating layer and perpendicular to the gate electrode, a free layer disposed on the spin orbit material layer, a barrier layer disposed on the free layer, a fixed layer disposed on the barrier layer, and a top electrode disposed on the fixed layer. The top electrode is parallel to the gate electrode and perpendicular to the spin orbit material electrode.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to SHE-MRAM memory cells. A memory cell array comprises one or more memory cells, wherein each of the one or more memory cells comprises a gate electrode, an insulating layer, an electrode comprised of a spin orbit material, a MTJ, and a top electrode parallel to the gate electrode. The gate electrode and the top electrode are perpendicular to the spin orbit material electrode. By applying a voltage to the gate electrode, passing a current along the spin orbit material electrode, and utilizing Rashba and/or spin hall effects, writability of select memory cells is enhanced, allowing for individual memory cells to be written upon without disturbing neighboring memory cells. Additionally, Rashba and/or spin hall effects in neighboring memory cells may be suppressed to ensure only the selected memory cell is written.

Figure 1A:
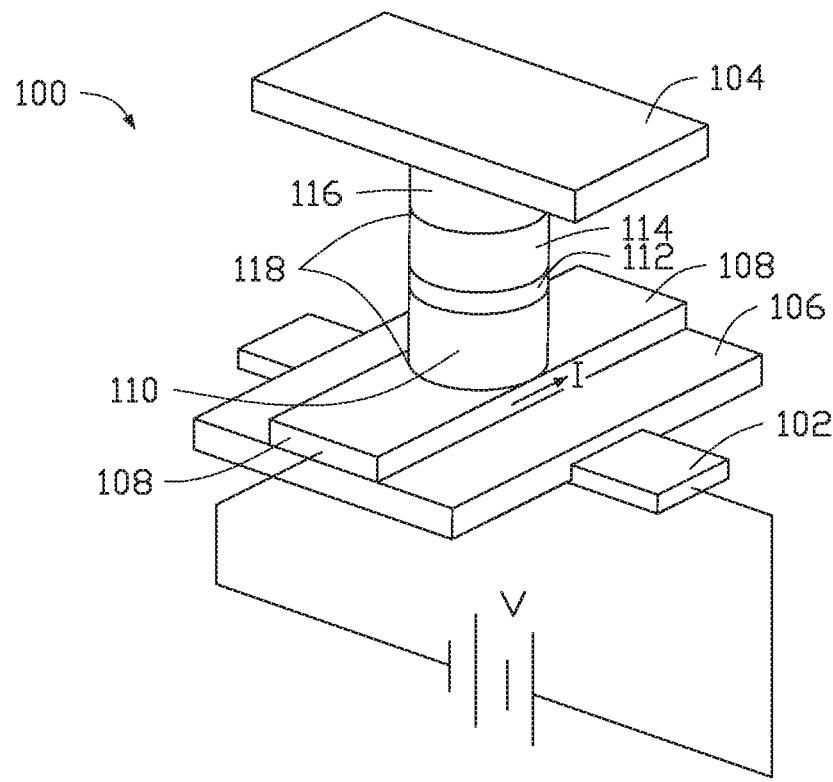
FIG. 1A illustrates a SHE-MRAM memory cell during a write operation, according to one embodiment.

FIG. 1A illustrates a non-volatile memory cell 100 during a write operation, according to one embodiment. The memory cell 100 may be a spin-hall-effect-based MRAM (SHE-MRAM). The memory cell 100 has a gate electrode 102 and a top electrode 104 parallel to the gate electrode 102. An insulating layer 106 is disposed on the gate electrode 102. In one embodiment, the insulating layer 106 may surround the gate electrode 102 on at least three sides. An electrode comprised of a spin orbit material 108 is disposed on the insulating layer 106. The spin orbit material electrode 108 is oriented perpendicular to both the gate electrode 102 and the top electrode 104. The spin orbit material electrode 108 and the top electrode 104 may be a word line and a bit line for read operations. The spin orbit material electrode 108 and the gate electrode 102 may be a word line and a bit line for write operations. The insulating layer 106 may be thinner than the spin orbit material electrode 108. A free layer 110, having a free magnetization, is disposed on the spin orbit material electrode 108, a barrier layer 112 is disposed on the free layer 110, a fixed layer 114, having a fixed magnetization, is disposed on the barrier layer 112, and a pinning layer 116 is disposed on the fixed layer 114. The top 104 electrode is then disposed on pinning layer 116.

In one embodiment, the free layer 110 is disposed directly on the spin orbit material electrode 108. The pinning layer 116 may determine the magnetization of the fixed layer 114. The free layer 110, the barrier layer 112, and the fixed layer 114 form a magnetic tunnel junction memory element (MTJ) 118, or data bits. The MTJ or bit 118 may be in a state representing either a 1 or a 0. The MTJ 118 is aligned linearly with the gate electrode 102 and the top electrode 104 such that the MTJ 118, the gate electrode 102, and the top electrode 104 are all disposed within a plane. In one embodiment, the gate 102, the top electrode 104, and the MTJ 118 are all the same width.

The gate electrode 102 and the top electrode 104 may be comprised of copper, and may have a thickness of about 20 nm-100 nm. The insulating layer 106 may be comprised of an oxide, and may have a thickness of about 5 nm. The free layer 110 and the fixed layer 114 may comprise Ni, Fe, Co, or an alloy combination thereof together with B, Ge, and/or Mn. The free layer 110 may have a thickness of about 1 nm-6 nm, and the fixed layer 114 may have a thickness of about 1 nm-6 nm. The barrier layer 112 may be comprised of an oxide, such as MgO, and may have a thickness of about 1 nm. The MTJ 118 may be simple pinned. The pinning layer 116 may be comprised of IrMn, PtMn, or FeMn, and may have a thickness of about 3 nm-7 nm. In one embodiment, the MTJ 118 may use a synthetic antiferromagnet (SAF) fixed layer with two magnetic layers coupled through a line nonmagnetic layer. In certain embodiments, the fixed ferromagnet layer may be a single ferromagnet comprising Ni, Fe, Co, or an alloy comprising a combination thereof together with B, Ge, Pt, and/or Mn, or superlattices of Co and Pt, Co and Pd, Co and Ni, and/or combinations and mixtures thereof.

The spin orbit material electrode 108 may be comprised of a material having a high atomic number, and may be a material that has large spin-orbit coupling. In one embodiment, the spin orbit material electrode 108 comprises HgTe or InGaAs. The spin orbit material electrode 108 may have a thickness of about 5 nm-10 nm. The spin orbit material electrode 108 may act as a third electrode, such as a write line or a word line. Additionally, the spin orbit material electrode 108 may act as either a top lead or a bottom lead of the MTJ 118 so long as the spin orbit material electrode 108 remains adjacent to the free layer 110. If the spin orbit material electrode 108 acts as the top lead of the MTJ 118, the gate electrode 102 and the insulating layer 106 would be disposed above the spin orbit material electrode 108 at the top of the structure. The spin orbit material electrode 108 is chosen to utilize spin Hall effects and/or Rashba effects. The spin orbit material electrode 108 may be selected to utilize only Rashba effects, only spin Hall effects, or a combination of both Rashba effects and spin Hall effects.

The spin Hall effects and/or the Rashba effects help enhance the writability of particular, individual bits 118. This can be done by applying a voltage, labeled V in FIG. 1A, to the gate electrode 102. A current labeled I may then be passed along the spin orbit material electrode 108 to switch the state of the free layer 110. By passing the current along the spin orbit material electrode 108, spin dependent scattering effects may be observed, leading to the creation of a spin current that may be transmitted into the free layer 110 to mediate switching. The direction of the current in the spin orbit material electrode 108 may determine what state is written to the bit 118. The current used to switch the bit 118 does not need to pass through the barrier layer 112 of the MTJ 118, which helps to prolong the life of the bit 118. By biasing a voltage on the gate electrode 102, the gate electrode 102 can enhance or weaken the Rashba and spin Hall effects experienced in the spin orbit material electrode 108. This gating coupled with the direct Rashba and spin Hall effects of the spin orbit material electrode 108 acts as a half-select mechanism for writing bits 118.

Figure 1B:
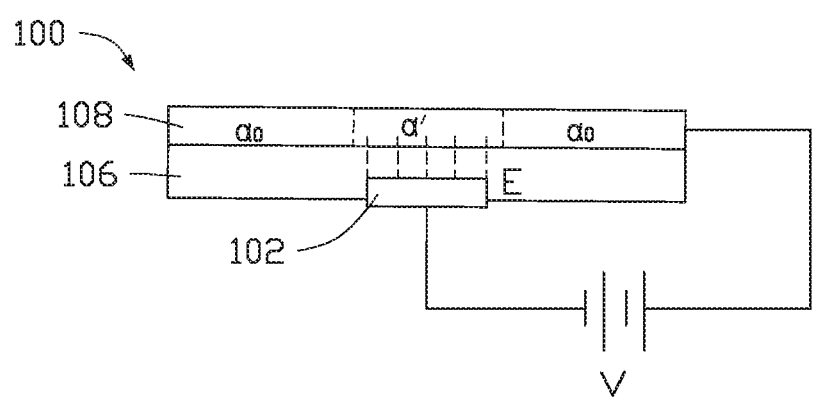
FIG. 1B illustrates a side view of the SHE-MRAM memory cell of FIG. 1A.

Additionally, an electric field may be applied to control the strength of the Rashba and spin Hall effects. FIG. 1B illustrates a side view of a portion of the memory cell 100 of FIG. 1A. In FIG. 1B, an electric field labeled E is shown being applied to a portion of the spin orbit material electrode 108, the insulating layer 106, and the gate electrode 102. The portion of the spin orbit material electrode 108 directly above the gate electrode 102 experiences a strengthening or weakening of Rashba and/or spin Hall effects. The initial strength of the Rashba and/or spin Hall effects in the spin orbit material electrode 108 is denoted by $\alpha_0$. The portion of the spin orbit material 108 that is not affected by the electric field E has a Rashba and/or spin Hall effect strength of $\alpha_0$. However, the portion of the spin orbit material 108 directly above the gate electrode 102 experiencing the electric field E has a Rashba and/or spin Hall effect strength of $\alpha'$, showing that the portion of the spin orbit material 108 experiencing the electric field E has a stronger or weaker Rashba and/or spin Hall effect than the portion of the spin orbit material electrode 108 not affected by the electric field E.

By utilizing the Rashba and spin Hall effects to enhance the writability of the bits 118, the memory cell 100 has an improved endurance, as there is a lower risk of breakdown in the barrier layer 112, and the efficiency of the write current is increased. Additionally, the write select transistor may be placed on only a word or bit line, rather than at every individual bit. In one embodiment, a transistor may not even be required. The SHE-MRAM cell 100 is also able to function similarly or the same as a STT-MRAM. However, STT-MRAM device is typically a current induced toggle MRAM, while the SHE-MRAM cell 100 is a voltage only effect. The SHE-MRAM memory cell 100 utilizing Rashba and spin Hall effects may be a fast switching, low power cell. In one embodiment, the memory cell 100 switches the state of the free layer in less than 10 ns. The memory cell 100 having the spin orbit material electrode 108 may eliminate problems with data disturb. Additionally, a IRID or a IRIT cross-point memory architecture may be utilized.

Figure 1C:
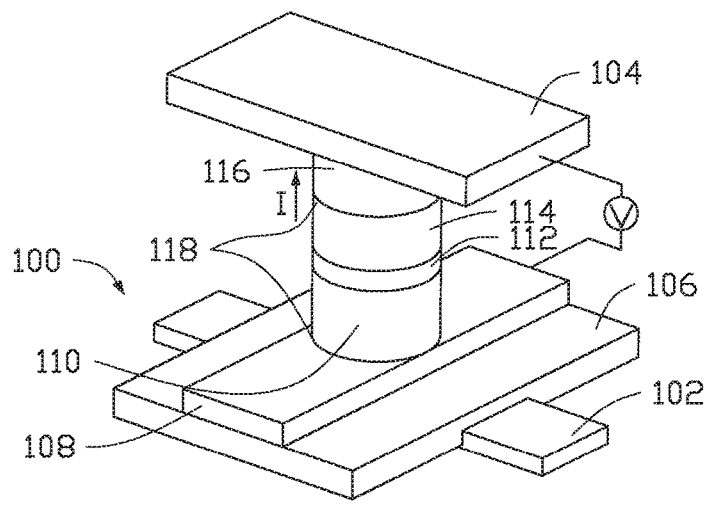
FIG. 1C illustrates a SHE-MRAM memory cell during a read operation, according to one embodiment.

FIG. 1C illustrates a memory cell 100 during a read operation, according to one embodiment. During the read operation, a voltage is applied to the top electrode 104, rather than the gate electrode 102. Current labeled I may then be passed through the MTJ 118 via the spin orbit material electrode 108. The resistance of the MTJ 118 is then read.

Figure 2:
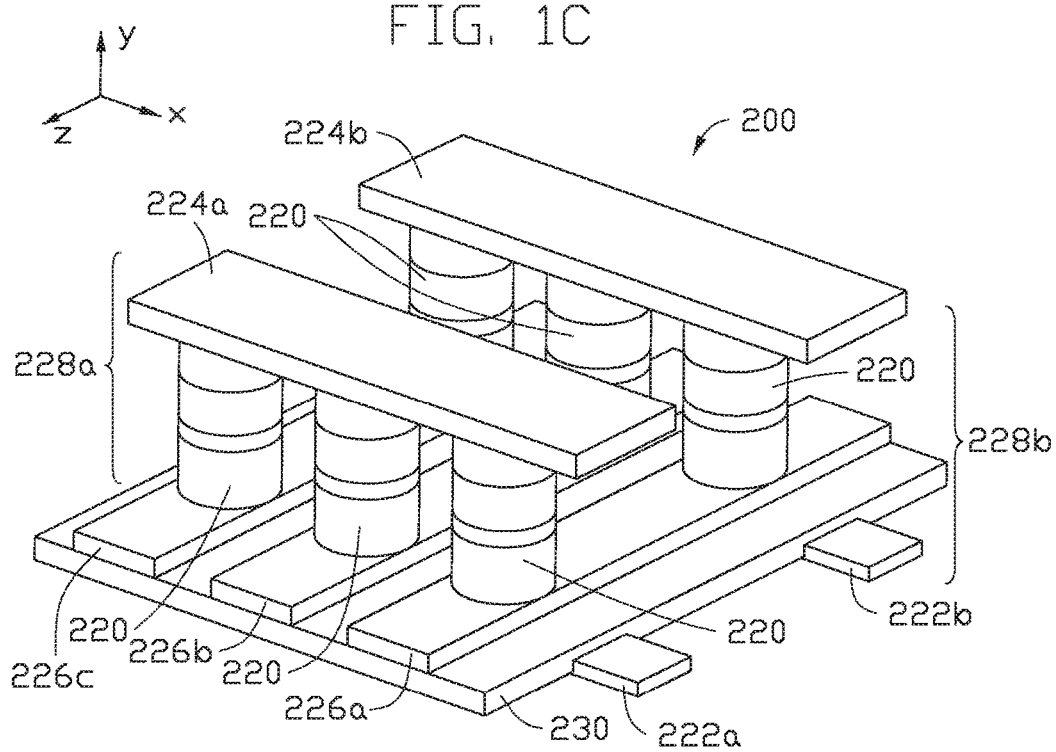
FIG. 2 illustrates a SHE-MRAM memory cell array, according to one embodiment.

FIG. 2 illustrates a memory cell array 200, according to one embodiment. The memory cell array 200 is comprised of one or more memory cells 220. The memory cells 220 may be the memory cell 100 of FIGS. 1A-1C. The memory cell array 200 of FIG. 2 shows six memory cells 220 comprising the array, however, the memory cell array 200 may be comprised of any number of memory cells 220. The memory cell array 200 may include one or more gate electrodes 222a-222b, one or more top electrodes 224a-224b, and one or more spin orbit material electrodes 226a-226c. Additionally, an insulating layer 230 may be present in the array 200. The insulating layer 230 may be disposed between the gate electrodes 222a-222b and the spin orbit material electrodes 226a-226c, as shown in FIGS. 1A-1C. In one embodiment, each of the memory cells 220 in the array 220 share one insulating layer 230, as shown in FIG. 2. In another embodiment, each memory cell 220 has an individual insulating layer 230.

In the memory cell array 200, two gate electrodes 222a, 222b are shown disposed in the x-direction, two top electrodes 224a, 224b are shown disposed in the x-direction, and three spin orbit material electrodes 226a, 226b, 226c are shown disposed in the z-direction. The gate electrodes 222a-222b are separated from the top electrodes 224a-224b in the y-direction. The spin orbit material electrodes 226a-226c may act as a third electrode to the memory cells 220. A first row 228a of memory cells 220 and a second row 228b of memory cells 220 are shown linearly in the x-direction. Each of the memory cells 220 disposed in the first row 228a share a gate electrode 222a and a top electrode 224a. Each of the memory cells 220 disposed in the second row 228b share a gate electrode 222b and a top electrode 224b. No two memory cells 220 in the first row 228a have a common spin orbit material electrode 226a-226c. Similarly, no two memory cells 220 in the second row 228b have a common spin orbit material electrode 226a-226c. However, one memory cell 220 located in the first row 228a may share a spin orbit material electrode 226a-226c with one memory cell 220 located in the second row 228b. For example, two memory cells 220, one from the first row 228a and one from the second row 228b, are disposed on each of the spin orbit material electrodes 226a-226c. By configuring the array 200 in this manner, no two memory cells 220 have the same three electrodes in common.

By utilizing the Rashba and spin Hall effects during writing, the Rashba and/or spin Hall effects may be enhanced in one memory cell 220 while the Rashba and/or spin Hall effects are suppressed in one or more other memory cells 220 in the array 200. For example, the Rashba and spin Hall effects may be enhanced in one memory cell 220 disposed on the spin orbit material electrode 226a while the other memory cell 220 disposed on the same spin orbit material electrode 226a experiences suppressed Rashba and spin Hall effects. Additionally, memory cells 220 disposed on a common bit line may be simultaneously written. For example, if the top electrode 224a of the first row 228a is a bit line, each memory cell 220 in the first row 228a may be written at the same time, as the voltage applied to the gate electrode 222a may activate all memory cells disposed in the first row 228a. The direction of the current along the respective spin orbit material electrodes 226a-226b on which the memory cells are disposed controls the state of each bit in the memory cells 220.

Therefore, by placing parallel gate and top electrodes perpendicular to a spin orbit material electrode in memory cells, Rashba and spin Hall effects may be utilized to enhance the efficiency of the write current to prevent breakdown of the MTJ of the memory cells. Additionally, the Rashba and spin Hall effects may be manipulated to enhance the effect used to write to selected memory cells while suppressing the effect in other memory cells, allowing select memory cells to be written without disturbing neighboring memory cells. Thus, the half-select method described above enhances the writability of the memory cells and eliminates data disturb between neighboring memory cells.

While the foregoing is directed to embodiments of the present disclosure, other and further embodiments of the disclosure may be devised without departing from the basic scope thereof, and the scope thereof is determined by the claims that follow.

What is claimed is:
1. A memory cell, comprising:
a gate electrode;
an insulating layer disposed on the gate electrode;
a spin orbit material electrode disposed on the insulating layer and perpendicular to the gate electrode;
a free layer disposed directly on the spin orbit material electrode;
a barrier layer disposed on the free layer;
a fixed layer disposed on the barrier layer; and a top electrode disposed on the fixed layer, wherein the top electrode is parallel to the gate electrode and perpendicular to the spin orbit material electrode.

2. The memory cell of claim 1, wherein the memory cell comprises a spin-Hall-effect-based magnetoresistive random access memory cell.

3. The memory cell of claim 1, wherein the spin orbit material electrode comprises a material having an atomic number between 30 and 85.

4. The memory cell of claim 1, wherein the spin orbit material electrode comprises one or more of mercury-telluride and indium-gallium-arsenide.

5. The memory cell of claim 1, wherein the free layer and the fixed layer comprise cobalt-iron-boron.

6. The memory cell of claim 1, wherein one or more of the gate electrode and the top electrode comprise copper.

7. The memory cell of claim 1, wherein the barrier layer comprises one or more of an oxide and magnesium oxide.

8. The memory cell of claim 1, wherein the insulating layer comprises an oxide.

9. A memory element, comprising:
a top electrode;
a bottom electrode comprising a spin orbit material; and
a memory tunnel junction (MTJ) of a memory cell at an intersection of the top electrode and the bottom electrode, wherein the spin orbit material of the bottom electrode is in contact with all of a surface of a free layer material of the MTJ.

10. The memory element of claim 9, wherein the memory cell comprises a spin-Hall-effect magnetoresistive random access memory cell.

11. The memory element of claim 9, wherein the spin orbit material comprises one or more of: a material having an atomic number between 30 and 85, mercury-telluride, and indium-gallium-arsenide.

12. The memory element of claim 9, wherein the MTJ further comprises a fixed layer, the fixed layer comprises cobalt-iron-boron, and the top electrode comprises copper.

13. The memory element of claim 9, further comprising a barrier material disposed between the free layer material and a reference layer material of the MTJ.

14. The memory element of claim 13, wherein the barrier material comprises an oxide.

15. A memory device, comprising:
a gate electrode substantially parallel to a top electrode;
a bottom electrode substantially perpendicular to the gate electrode and the top electrode; and
a memory tunnel junction (MTJ) of a memory cell in linear alignment with the top electrode and the gate electrode, the MTJ disposed on a portion of the bottom electrode directly above the gate electrode in the linear alignment.

16. The memory device of claim 15, wherein the bottom electrode comprises a spin orbit material.

17. The memory device of claim 16, wherein the spin orbit material comprises one or more of: a material having an atomic number between 30 and 85, mercury-telluride, and indium-gallium-arsenide.

18. The memory device of claim 16, wherein the memory cell comprises a spin-Hall-effect magnetoresistive random access memory (SHE-MRAM) memory cell.

19. The memory device of claim 16, wherein the MTJ comprises a free layer, and wherein the free layer of the MTJ is on the portion of the bottom electrode directly above the gate electrode in the linear alignment.

20. The memory device of claim 19, wherein the MTJ comprises a fixed layer, wherein the fixed layer comprises cobalt-iron-boron, and wherein the top electrode comprises copper.

21. The memory device of claim 19, wherein the MTJ further comprises: a reference layer having a fixed magnetization; and a barrier layer configured to isolate the free layer from the reference layer.

* * * * *